(12) United States Patent
Heo et al.

(10) Patent No.: US 11,362,697 B2
(45) Date of Patent: *Jun. 14, 2022

(54) MULTILAYER PRINTED CIRCUIT BOARD AND ELECTRONIC DEVICE INCLUDING THE SAME

(71) Applicant: Samsung Electronics Co., Ltd., Suwon-si (KR)

(72) Inventors: Jinsu Heo, Suwon-si (KR); Seungtae Ko, Suwon-si (KR); Sangho Lim, Suwon-si (KR)

(73) Assignee: Samsung Electronics Co., Ltd., Suwon-si (KR)

( * ) Notice: Subject to any disclaimer, the term of this patent is extended or adjusted under 35 U.S.C. 154(b) by 0 days.

This patent is subject to a terminal disclaimer.

(21) Appl. No.: 16/598,111

(22) Filed: Oct. 10, 2019

(65) Prior Publication Data

US 2020/0044679 A1 Feb. 6, 2020

Related U.S. Application Data

(63) Continuation of application No. 15/834,627, filed on Dec. 7, 2017, now Pat. No. 10,447,330.

(51) Int. Cl.
  *H05K 1/02* (2006.01)
  *H04B 1/40* (2015.01)
(52) U.S. Cl.
  CPC .......... *H04B 1/40* (2013.01); *H05K 1/025* (2013.01); *H05K 1/0219* (2013.01);
  (Continued)

(58) Field of Classification Search
  None
  See application file for complete search history.

(56) References Cited

U.S. PATENT DOCUMENTS 5,305,000 A  4/1994  Harris
6,483,406 B1  11/2002  Sawa et al.
(Continued)

FOREIGN PATENT DOCUMENTS

CN  101453825 A  6/2009
EP  0 977 298 A2  2/2000
(Continued)

OTHER PUBLICATIONS

International Search Report dated Feb. 19, 2018, issued in International Application No. PCT/KR2017/014289.
(Continued)

*Primary Examiner* — Tuan A Tran
(74) *Attorney, Agent, or Firm* — Jefferson IP Law, LLP

(57) ABSTRACT

A multilayer printed circuit board (PCB) including a plurality of substrate layers formed in stack is provided. The multilayer printed circuit board includes a first substrate layer located on an outer side of the plurality of substrate layers, and a second substrate layer located on another outer side of the plurality of substrate layers that is opposite to the first substrate layer. The multilayer printed circuit board further includes a transmission line, connecting a first point of the first substrate layer and a second point of the second substrate layer, which passes through the first and second substrate layers, and includes a sub-transmission line disposed between and extended along at least two adjacent substrate layers among the plurality of substrate layers.

17 Claims, 14 Drawing Sheets

(52) U.S. Cl.
CPC ......... *H05K 1/0298* (2013.01); *H05K 1/0243* (2013.01); *H05K 1/0251* (2013.01); *H05K 2201/0715* (2013.01); *H05K 2201/0979* (2013.01); *H05K 2201/09618* (2013.01); *H05K 2201/09672* (2013.01); *H05K 2201/10098* (2013.01)

(56) References Cited

U.S. PATENT DOCUMENTS

| | | | | |
|---|---|---|---|---|
| 6,538,213 | B1* | 3/2003 | Carden | H01L 23/49827 174/260 |
| 6,653,572 | B2* | 11/2003 | Ishiwa | H05K 1/144 174/250 |
| 6,876,554 | B1* | 4/2005 | Inagaki | H01G 4/224 361/763 |
| 6,975,517 | B1* | 12/2005 | Kwong | H05K 1/16 361/763 |
| 7,142,071 | B2* | 11/2006 | Coleman | H01P 1/06 333/24 R |
| 7,337,537 | B1* | 3/2008 | Smetana, Jr. | H05K 3/429 29/846 |
| 7,642,635 | B2* | 1/2010 | Kikuchi | H01L 23/5383 257/686 |
| 8,154,360 | B2* | 4/2012 | Uemichi | H01L 23/49822 333/238 |
| 8,368,484 | B2* | 2/2013 | Uejima | H03H 7/463 333/101 |
| 8,569,880 | B2* | 10/2013 | Inagaki | H01L 21/4857 257/700 |
| 8,981,881 | B2* | 3/2015 | Masuda | H01L 23/047 257/723 |
| 9,459,285 | B2* | 10/2016 | Ma | G01R 1/06738 |
| 9,967,968 | B2* | 5/2018 | Hung | H05K 1/0219 |
| 2002/0104681 | A1* | 8/2002 | Ishiwa | H05K 1/144 174/250 |
| 2004/0050585 | A1 | 3/2004 | Audet et al. | |
| 2004/0257178 | A1 | 12/2004 | Shimoda | |
| 2007/0040735 | A1* | 2/2007 | Matsuo | H05K 1/167 342/175 |
| 2007/0217175 | A1* | 9/2007 | Young | H01L 23/66 361/782 |
| 2010/0307798 | A1 | 12/2010 | Izadian | |
| 2011/0067915 | A1 | 3/2011 | Kim et al. | |
| 2013/0093096 | A1 | 4/2013 | Furumiya et al. | |
| 2014/0002209 | A1* | 1/2014 | Ono | H04B 1/0057 333/101 |
| 2014/0202750 | A1* | 7/2014 | Kogure | H05K 1/165 174/260 |
| 2015/0295296 | A1 | 10/2015 | Ikemoto et al. | |
| 2016/0066415 | A1* | 3/2016 | Kataoka | H05K 1/0245 361/774 |

FOREIGN PATENT DOCUMENTS

EP 2154747 A1 2/2010
JP 2004-111967 A 4/2004

OTHER PUBLICATIONS

Extended European Search Report dated Sep. 2, 2019, issued in European Application No. 17880469.6.
Chinese Office Action dated Dec. 30, 2021, issued in Chinese Patent Application No. 201780071191.2.

* cited by examiner

MULTILAYER PRINTED CIRCUIT BOARD AND ELECTRONIC DEVICE INCLUDING THE SAME

CROSS-REFERENCE TO RELATED APPLICATION(S)

This application is a continuation application of prior application Ser. No. 15/834,627, filed on Dec. 7, 2017, which has issued as U.S. Pat. No. 10,447,330 on Oct. 15, 2019 and was based on and claimed priority under 35 U.S.C. § 119(a) of a Korean patent application number 10-2016-0173002, filed on Dec. 16, 2016, in the Korean Intellectual Property Office, the disclosure of which is incorporated by reference herein in its entirety.

TECHNICAL FIELD

The present disclosure relates to a multilayer printed circuit board capable of reducing loss in signal transmission and to an electronic device including the same.

BACKGROUND

To meet increasing demands for wireless data traffic after commercialization of the fourth generation (4G) communication system, efforts have been made to develop an improved fifth generation (5G) or pre-5G communication system. Therefore, the 5G or pre-5G communication system is also called a Beyond 4G Network or a Post long-term evolution (LTE) System.

The 5G communication system is considered to be implemented in higher frequency millimeter wave (mmWave) bands so as to accomplish higher data rates. To decrease propagation loss of the radio waves and increase the transmission distance, various techniques such as beamforming, massive multiple-input multiple-output (MIMO), full dimensional MIMO (FD-MIMO), array antenna, analog beamforming, and large scale antenna techniques are being discussed in the 5G communication system.

Additionally, in the 5G communication system, development for system network improvement is underway based on an advanced small cell, a cloud radio access network (cloud RAN), a ultra-dense network, device-to-device (D2D) communication, wireless backhaul, a moving network, cooperative communication, coordinated multi-points (CoMP), reception-end interference cancellation, and the like.

Further, in the 5G system, hybrid frequency shift keying (FSK) and quadrature amplitude modulation (QAM) modulation (FQAM) and sliding window superposition coding (SWSC) are being developed as an advanced coding modulation (ACM) schemes, and filter bank multi carrier (FBMC), non-orthogonal multiple access (NOMA), and sparse code multiple access (SCMA) are also being developed as advanced access technologies.

Meanwhile, in the 5G system as described above, electronic devices and base stations are confronted with an increasing complexity in an antenna module. This results in an increase in a transmission line between the antenna module and a circuit board included in the electronic device for using the 5G system. Therefore, there is a need for reducing a signal loss due to an increase in the transmission line.

The above information is presented as background information only to assist with an understanding of the present disclosure. No determination has been made, and no assertion is made, as to whether any of the above might be applicable as prior art with regard to the present disclosure.

SUMMARY

Aspects of the present disclosure are to address at least the above-mentioned problems and/or disadvantages and to provide at least the advantages described below. Accordingly, an aspect of the present disclosure is to provide a multilayer printed circuit board for reducing a signal loss occurring in a transmission line connected to an antenna module and an electronic device including the multilayer printed circuit board.

In accordance with an aspect of the present disclosure, a multilayer printed circuit board is provided. The multilayer printed circuit board includes a plurality of substrate layers formed in stack may comprise a first substrate layer located on an outer side of the plurality of substrate layers, a second substrate layer located on another outer side of the plurality of substrate layers that is opposite to the first substrate layer, and a transmission line, connecting a first point of the first substrate layer and a second point of the second substrate layer, which passes through the first and second substrate layers, and includes a sub-transmission line disposed between and extended along at least two adjacent substrate layers among the plurality of substrate layers.

In accordance with another aspect of the present disclosure, an electronic device is provided. The electronic device includes a multilayer printed circuit board including a plurality of substrate layers formed in stack, and the multilayer printed circuit board may include a first substrate layer located on an outer side of the plurality of substrate layers, a second substrate layer located on another outer side of the plurality of substrate layers that is opposite to the first substrate layer, and a transmission line, connecting a first point of the first substrate layer and a second point of the second substrate layer, which passes through the first and second substrate layers, and includes a sub-transmission line disposed between and extended along at least two adjacent substrate layers among the plurality of substrate layers.

In accordance with another aspect of the present disclosure, it is possible to reduce a signal loss that occurs in the transmission line that connects substrate elements and an antenna module. This reduction of signal loss may increase transmission power of a signal transmitted from the antenna module of the electronic device, thus ensuring the coverage of a wide area even with a small number of base stations. Further, this technique is cost-effective.

Other aspects, advantages, and salient features of the disclosure will become apparent to those skilled in the art from the following detailed description, which, taken in conjunction with the annexed drawings, discloses various embodiments of the present disclosure.

BRIEF DESCRIPTION OF THE DRAWINGS

The above and other aspects, features, and advantages of certain embodiments of the present disclosure will be more apparent from the following description taken in conjunction with the accompanying drawings, in which.

Throughout the drawings, it should be noted that like reference numbers are used to depict the same or similar elements, features, and structures.

DETAILED DESCRIPTION

Figure 1:
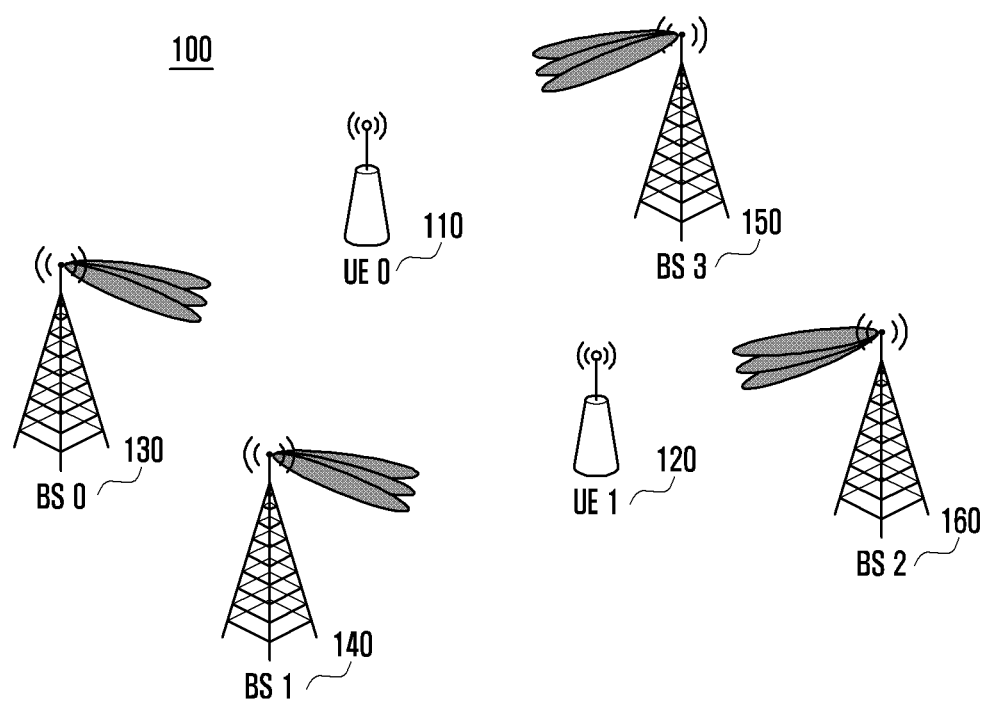
FIG. 1 is a diagram illustrating a typical fifth generation (5G) communication system according to an embodiment of the present disclosure.

The following description with reference to the accompanying drawings is provided to assist in a comprehensive understanding of various embodiments of the present disclosure as defined by the claims and their equivalents. It includes various specific details to assist in that understanding but these are to be regarded as merely exemplary. Accordingly, those of ordinary skill in the art will recognize that various changes and modifications of the various embodiments described herein can be made without departing from the scope and spirit of the present disclosure. In addition, descriptions of well-known functions and constructions may be omitted for clarity and conciseness.

The terms and words used in the following description and claims are not limited to the bibliographical meanings, but, are merely used by the inventor to enable a clear and consistent understanding of the present disclosure. Accordingly, it should be apparent to those skilled in the art that the following description of various embodiments of the present disclosure is provided for illustration purpose only and not for the purpose of limiting the present disclosure as defined by the appended claims and their equivalents.

It is to be understood that the singular forms "a," "an," and "the" include plural referents unless the context clearly dictates otherwise. Thus, for example, reference to "a component surface" includes reference to one or more of such surfaces.

In describing the embodiments, descriptions of techniques which are well known in the art to which the present disclosure belongs and which are not directly related to the present disclosure will not be described or illustrated in detail. This is to avoid obscuring the subject matter of the present disclosure.

For the same reason, some elements are exaggerated, omitted or shown schematically in the accompanying drawings. Also, the size of each element does not entirely reflect the actual size. In the drawings, the same or corresponding elements are denoted by the same reference numerals.

The advantages and features of the present disclosure and the manner of achieving them will become apparent with reference to the embodiments described in detail below with reference to the accompanying drawings. The present disclosure may, however, be embodied in many different forms and should not be construed as limited to the embodiments set forth herein. Rather, these embodiments are provided so that this disclosure will be thorough and complete, and will fully convey the scope of the disclosure to those skilled in the art. To fully disclose the scope of the disclosure to those skilled in the art, and the disclosure is only defined by the scope of the claims.

It will be understood that each block of the flowchart illustrations, and combinations of blocks in the flowchart illustrations, may be implemented by computer program instructions. These computer program instructions may be provided to a processor of a general purpose computer, special purpose computer, or other programmable data processing apparatus to produce a machine, such that the instructions, which are executed via the processor of the computer or other programmable data processing apparatus, generate means for implementing the functions specified in the flowchart block or blocks. These computer program instructions may also be stored in a non-transitory computer usable or computer-readable memory that may direct a computer or other programmable data processing apparatus to function in a particular manner, such that the instructions stored in the non-transitory computer usable or computer-readable memory produce an article of manufacture including instruction means that implement the function specified in the flowchart block or blocks. The computer program instructions may also be loaded onto a computer or other programmable data processing apparatus to cause a series of operational steps to be performed on the computer or other programmable apparatus to produce a computer implemented process such that the instructions that are executed on the computer or other programmable apparatus provide steps for implementing the functions specified in the flowchart block or blocks.

And each block of the flowchart illustrations may represent a module, segment, or portion of code, which comprises one or more executable instructions for implementing the specified logical function(s). It should also be noted that in some alternative implementations, the functions noted in the blocks may occur out of the order. For example, two blocks shown in succession may in fact be executed substantially concurrently or the blocks may sometimes be executed in the reverse order, depending upon the functionality involved.

The term "unit", as used herein, may refer to a software or hardware component or device, such as a field programmable gate array (FPGA) or application specific integrated circuit (ASIC), which performs certain tasks. A unit may be configured to reside on an addressable storage medium and configured to execute on one or more processors. Thus, a unit may include, by way of example, components, such as software components, object-oriented software components, class components and task components, processes, functions, attributes, procedures, subroutines, segments of program code, drivers, firmware, microcode, circuitry, data, databases, data structures, tables, arrays, and variables. The functionality provided for in the components and units may be combined into fewer components and units or further separated into additional components and units. In addition, the components and units may be implemented to drive one or more central processing units (CPUs) in a device or a secure multimedia card. Also, in embodiments, a unit may include one or more processors.

An electronic device according to the present disclosure may include a mobile terminal in general, and may indicate any device that has subscribed to a mobile communication system and is to receive a service from the mobile communication system. The mobile terminal may include a smart device such as a smart phone or a tablet PC, which is merely exemplary and not to be construed as a limitation of the present disclosure.

FIG. 1 is a diagram illustrating a typical fifth generation (5G) communication system 100 according to an embodiment of the present disclosure.

Referring to FIG. 1, in order to allow the electronic devices (also referred to as a terminal or a user equipment (UE)) 110 and 120 to perform stable mobile communication, a plurality of 5G base stations 130, 140, 150, and 160 may be installed. For example, the 5G communication system 100 may be designed, based on the antenna beam coverage and the antenna radiation output such as equivalent isotropic radiated power (EIRP) of the base stations 130, 140, 150, and 160.

Figure 2A:
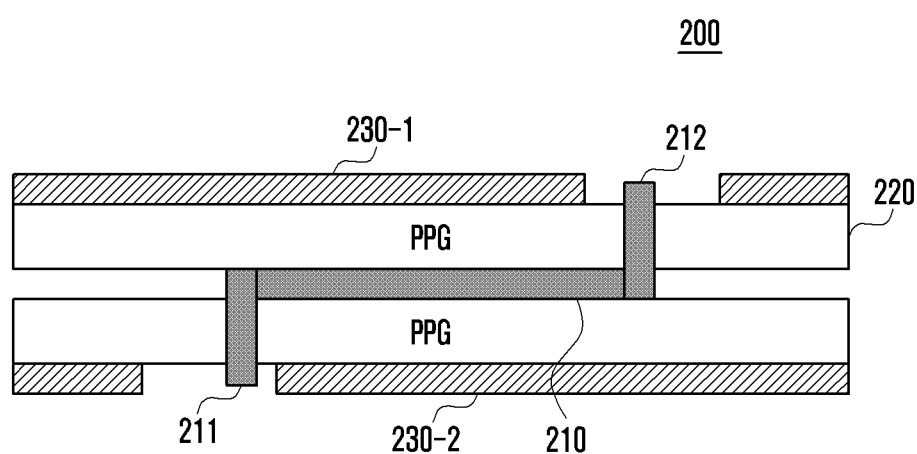
FIGS. 2A and 2B are diagrams illustrating a normal transmission line and a plurality of layers including the transmission line according to various embodiments of the present disclosure.
Figure 2B:
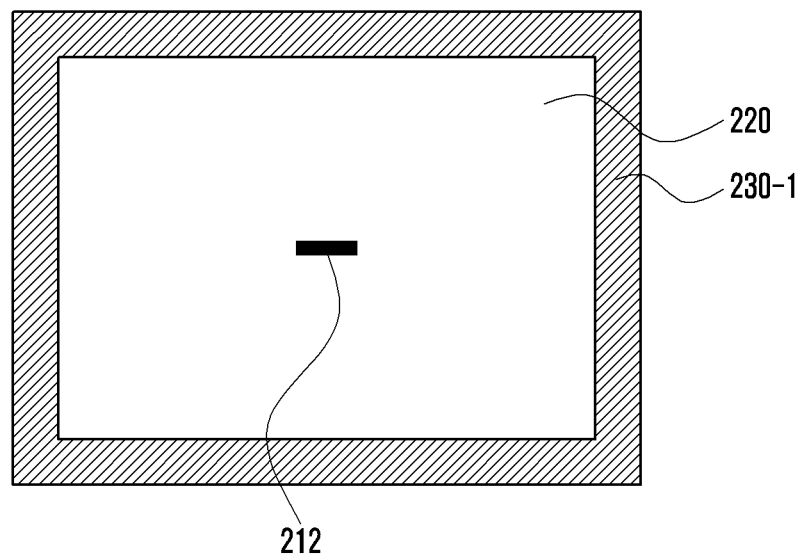

FIGS. 2A and 2B are diagrams illustrating a normal transmission line and a plurality of layers including the transmission line according to various embodiments of the present disclosure.

Referring to FIG. 2A a part of a substrate is included in the electronic device for performing wireless communication, namely, a part for connecting an antenna module. For example, the substrate may be a multilayer printed circuit board (multilayer PCB) composed of a plurality of layers. In addition, the antenna module may be connected to an upper part of the multilayer PCB. FIG. 2A shows the upper part of the multilayer printed circuit board (PCB) connected to the antenna module.

Hereinafter, the upper part of the multilayer PCB connected to the antenna module as shown in FIG. 2A is defined as a signal transmission unit 200, which is an element for connecting a chip, a processor, etc. included in the electronic device to the antenna module.

The signal transmission unit 200 may include a transmission line 210 for connecting the substrate and the antenna module. The transmission line 210 may be connected to the substrate including various elements of the electronic device at a first point 211 and connected to the antenna module at a second point 212. For example, a signal generated in the electronic device may be transmitted to the antenna module via the transmission line 210.

Although FIG. 2A merely shows one transmission line 210, the number of transmission lines 210 may increase proportionally to the number of antenna modules.

The transmission line 210 may be interposed between a plurality of layers 230 and extended along a certain layer. In addition, the transmission line 210 may be surrounded by ground layers 230-1 and 230-2. The plurality of layers 220 forming the respective layers of PCB may be implemented as prepreg (PPG).

The ground layers 230-1 and 230-2 may be formed on outer sides of the plurality of layers 220 in which the transmission line 210 is interposed. FIG. 2A is a cross-sectional view of the signal transmission unit 200. Therefore, although not shown in FIG. 2A, the ground layers 230-1 and 230-2 may be formed in the vertical direction as well as in the horizontal direction. For example, a certain ground layer (not shown) that connects the first ground layer 230-1 and the second ground layer 230-2 of the ground layers 230-1 and 230-2 in a direction perpendicular to the plurality of layers 220 may be further formed.

FIG. 2B is a top view of the signal transmission unit 200 shown in FIG. 2A.

Referring to FIG. 2B, the first ground layer 230-1 may be formed to surround the transmission line 210 in a rectangular shape.

In the signal transmission unit 200 as shown in FIGS. 2A and 2B, the transmission line 210 may be subjected to a signal loss. For example, if the transmission power of a transmission signal generated by the electronic device is 10, the transmission power of the transmission signal transmitted to the antenna module may be reduced to 4 due to a signal loss that occurs during the transmission through the transmission line 210. Since signals are transmitted with low transmission power, it is therefore beneficial to install a larger number of base stations.

In addition, the signal loss occurring in the transmission line is proportional to the length of the transmission line. As the number of antenna modules used in the 5G communication system increases, the length of the transmission line also increases. Therefore, in the 5G communication system, the signal loss occurring in the transmission line is further increased in comparison with the existing communication system.

In addition, as described above, the 5G communication system performs communication through a super high frequency band. In this super high frequency band, the signal loss occurring in the transmission line may increase depending on the characteristics of materials of the transmission line. Therefore, the transmission power of the electronic device may be greatly reduced due to an increase in the signal loss.

Hereinafter, a method according to the present disclosure for reducing a signal loss occurring in the transmission line will be described in detail. This technique may be advantageously applied to the 5G communication system as described above. This is, however, exemplary only and not to be construed as a limitation. Additionally, the technique of the disclosure may be also applied to any communication system before and after 5G.

Figure 3A:
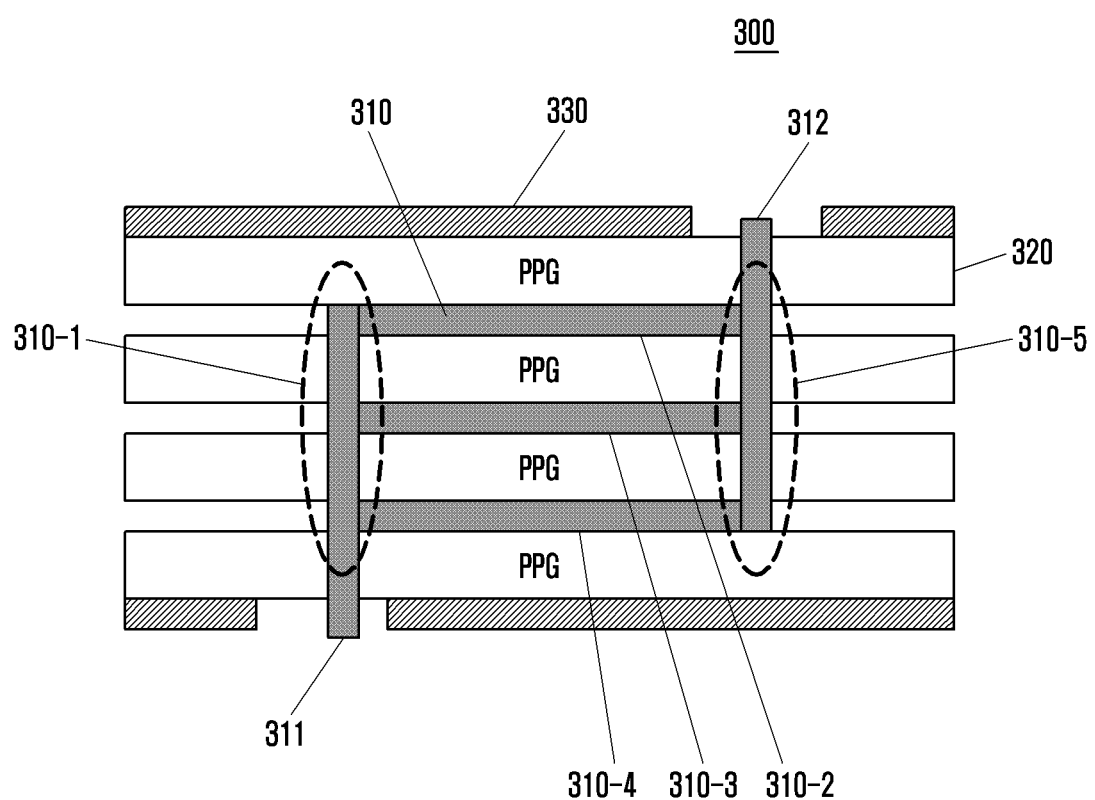
FIGS. 3A and 3B are diagrams illustrating a structure of a signal transmission unit according to various embodiments of the present disclosure.
Figure 3B:
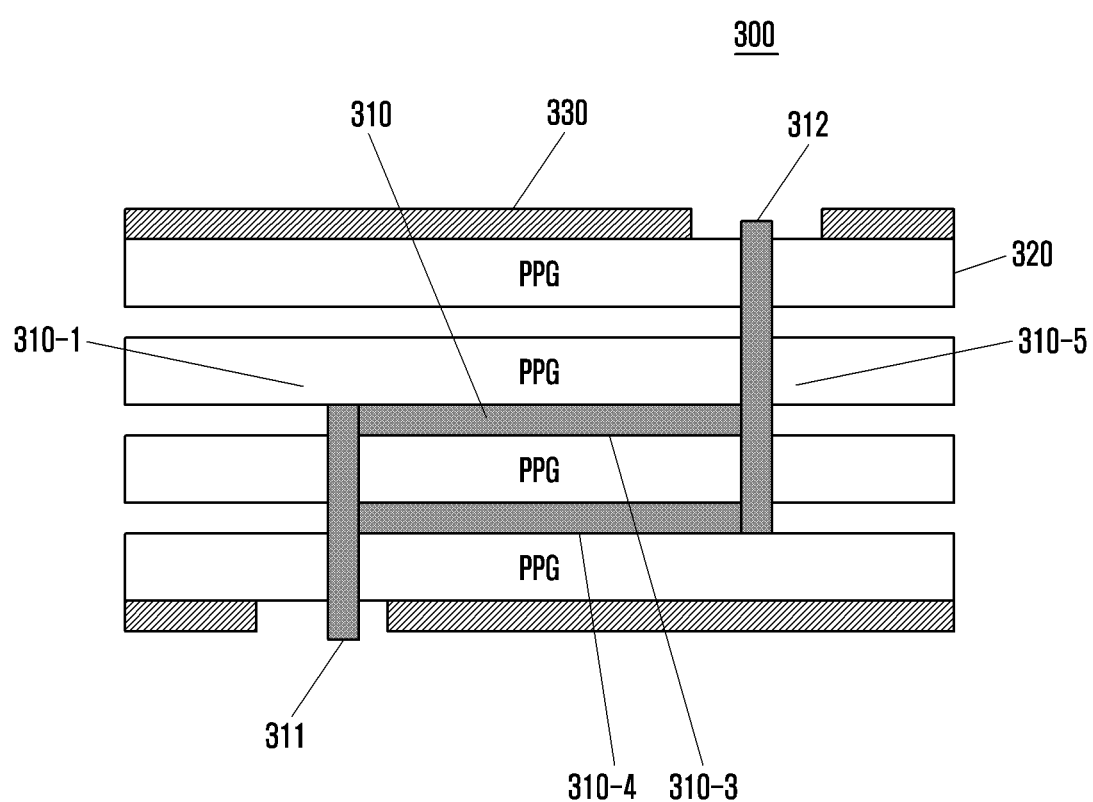

FIGS. 3A and 3B are diagrams illustrating a structure of a signal transmission unit 300 according to various embodiments of the present disclosure.

Referring to FIGS. 3A and 3B, the signal transmission unit 300 may include a transmission line 310 that connects a substrate and an antenna module, a plurality of layers 320 that is formed in stack, and a ground layer 330 that is formed on outer sides of the plurality of layers 320 and surrounds the transmission line 310.

The transmission line 310 may include a plurality of sub-transmission lines. In other words, the transmission line 310 may be connected to the substrate at one starting point thereof and then separated into two or more branches. Thereafter, the branches may be combined into one transmission line, which may be connected to one antenna module.

Specifically, as shown in FIG. 3A, the transmission line 310 may include, at a first point 311 connected to the substrate, a first sub-transmission line 310-1 which is extended in a direction perpendicular to the plurality of layers 320.

In addition, the transmission line 310 may further include a second sub-transmission line 310-2, a third sub-transmission line 310-3 and a fourth sub-transmission line 310-4, which are connected to the first sub-transmission line 310-1 at different points and respectively extended along the plurality of layers 320.

The second sub-transmission line 310-2, the third sub-transmission line 310-3 and the fourth sub-transmission line 310-4 may be connected to a fifth sub-transmission line 310-5 which is extended in a direction perpendicular to the plurality of layers 320 and connected to the antenna module at a second point 312.

The first to fifth sub-transmission lines 310-1, 310-2, 310-3, 310-4, and 310-5 may constitute one transmission line 310 as a whole.

When the signal transmission unit 300 is implemented as shown in FIG. 3A, the transmission line 310 thereof may have a narrower width than that of the transmission line 210 included in the typical signal transmission unit 200 as shown in FIG. 2A. For example, when the width of the transmission line 210 included in the typical signal transmission unit 200 as shown in FIG. 2A is 35 μm, the width of the transmission line 310 included in the signal transmission unit 300 as shown in FIG. 3A may be implemented as 5 μm.

As the width of the transmission line 310 is narrowed, it is possible to miniaturize the signal transmission unit 300.

Meanwhile, although FIG. 3A exemplarily shows three sub-transmission lines 310-2, 310-3 and 310-4 extended along the plurality of layers 320, there are no restrictions on the number of sub-transmission lines as long as the number is two or more.

FIG. 3B shows a modification in the signal transmission unit 300 shown in FIG. 3A. As shown in FIG. 3B, the transmission line 310 may include, at the first point 311 connected to the substrate, a first sub-transmission line 310-1 which is extended in a direction perpendicular to the plurality of layers 320.

In addition, the transmission line 310 may further include a second sub-transmission line 310-2 and a third sub-transmission line 310-3, which are connected to the first sub-transmission line 310-1 at different points and respectively extended along the plurality of layers 320.

The second sub-transmission line 310-2 and the third sub-transmission line 310-3 may be connected to a fourth sub-transmission line 310-4 which is extended in a direction perpendicular to the plurality of layers 320 and connected to the antenna module at the second point 312.

The first to fourth sub-transmission lines 310-1, 310-2, 310-3, and 310-4 may constitute one transmission line 310 as a whole.

Figure 4A:
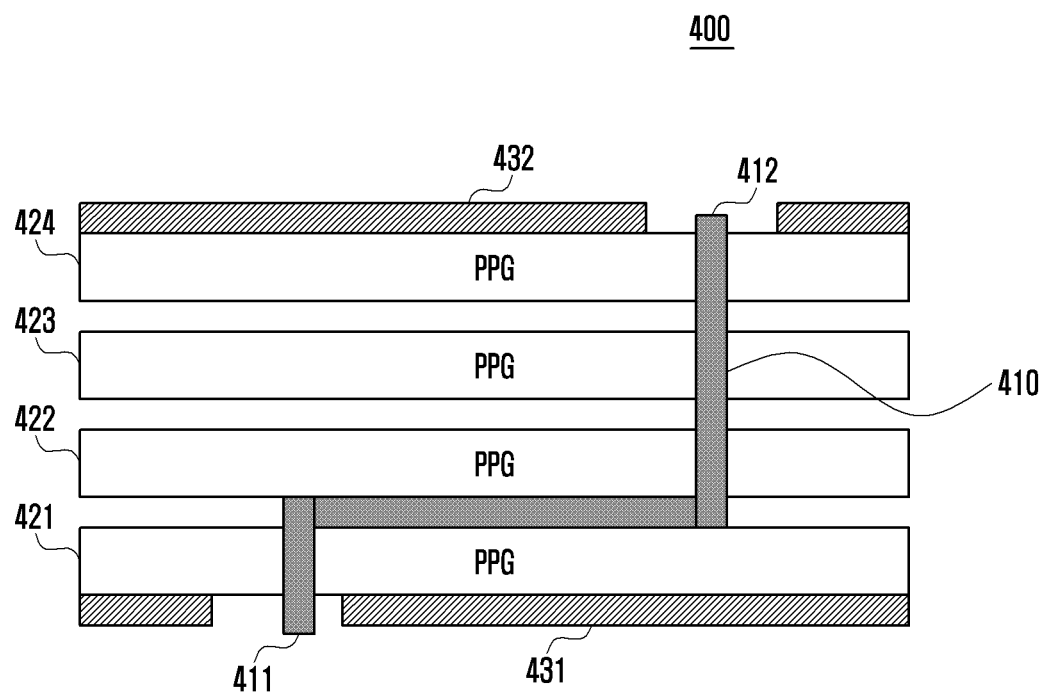
FIGS. 4A and 4B are diagrams illustrating a structure of a signal transmission unit according to various embodiments of the present disclosure.
Figure 4B:
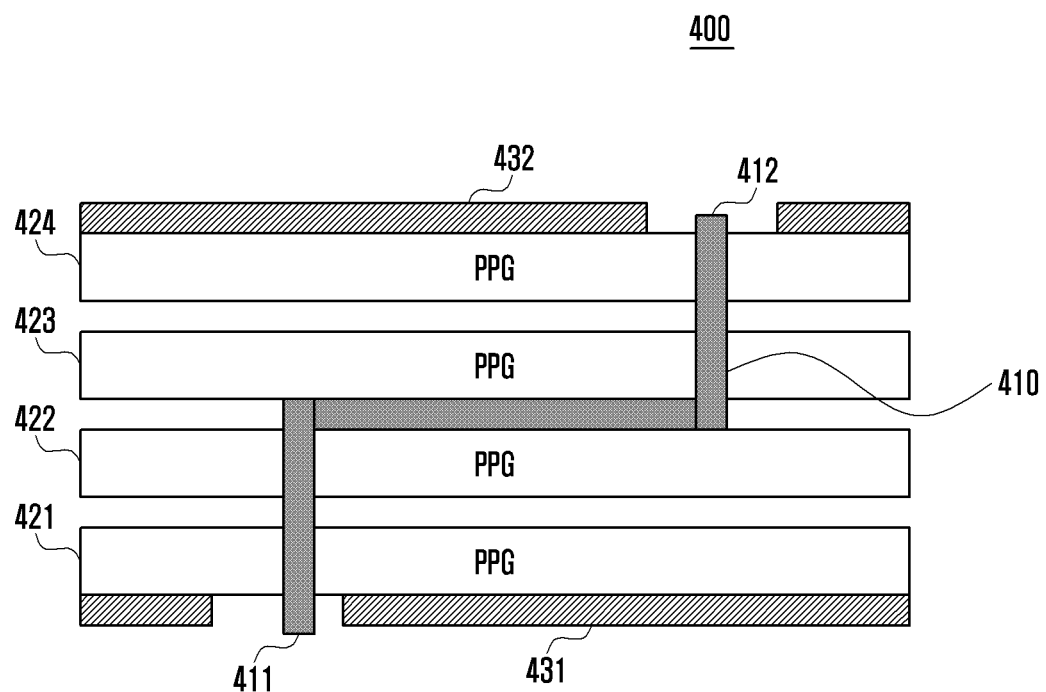

FIGS. 4A and 4B are diagrams illustrating a structure of a signal transmission unit 400 according to various embodiments of the present disclosure.

Referring to FIGS. 4A and 4B, the signal transmission unit 400 does not include a sub-transmission line extended along a plurality of layers. The signal transmission unit 400 is characterized by including two or more layers above or under the transmission line extended along a certain layer.

Specifically, as shown in FIG. 4A, the transmission line 310 may be extended in a direction perpendicular to a first layer 421 at a first point 411 connected to the substrate. A first ground layer 431 may be disposed under the first layer 421.

In addition, the transmission line 410 may be extended along the first layer 421. For example, the transmission line 410 may be extended between the first layer 421 and a second layer 422 which is disposed above the first layer 421.

The transmission line 410 extended along the first layer 421 may be further extended in a direction perpendicular to the second layer 422, a third layer 423, and a fourth layer 424. Then, the transmission line 410 may be connected to the antenna module at a second point 412.

A second ground layer 432 may be disposed above the fourth layer 424. FIG. 4A is a cross-sectional view of the signal transmission unit 400. Therefore, although not shown in FIG. 4A, the ground layers 431 and 432 may be formed in the vertical direction as well as in the horizontal direction. For example, a plurality of ground lines (not shown) that connect the first ground layer 431 and the second ground layer 432 in a direction perpendicular to the plurality of layers 421, 422, 423, and 424 may be further formed.

Meanwhile, FIG. 4B shows a modification in the signal transmission unit 400 shown in FIG. 4A. As shown in FIG. 4B, the transmission line 410 may be extended in a direction perpendicular to the first and second layers 421 and 422 at the first point 411 connected to the substrate. The first ground layer 431 may be disposed under the first layer 421.

In addition, the transmission line 410 may be extended along the second layer 422. For example, the transmission line 410 may be extended between the second layer 422 and the third layer 423 which is disposed above the second layer 422.

The transmission line 410 extended along the second layer 422 may be further extended in a direction perpendicular to the third and fourth layers 423 and 424. Then, the transmission line 410 may be connected to the antenna module at the second point 412.

The second ground layer 432 may be disposed above the fourth layer 424. FIG. 4B is a cross-sectional view of the signal transmission unit 400. Therefore, although not shown in FIG. 4B, the ground layers 431 and 432 may be formed in the vertical direction as well as in the horizontal direction. For example, a plurality of ground lines (not shown) that connect the first ground layer 431 and the second ground layer 432 in a direction perpendicular to the plurality of layers 421, 422, 423, and 424 may be further formed.

Meanwhile, the transmission line 410 of the signal transmission unit 400 shown in FIGS. 4A and 4B may be greater in width than the transmission line 310 of the signal transmission unit 300 shown in FIGS. 3A and 3B.

According to still another embodiment, the transmission line may be separated into a plurality of branches and be extended along a direction that the plurality of layers extend.

Figure 5A:
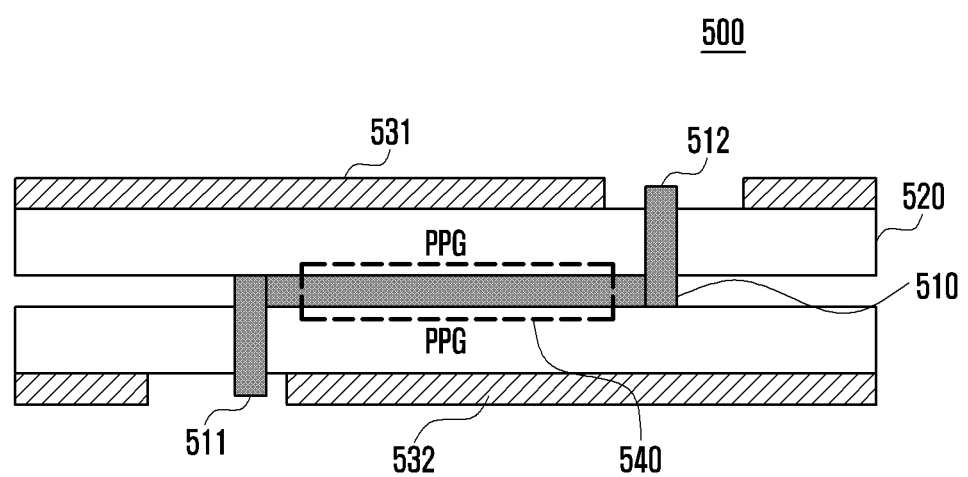
FIGS. 5A and 5B are diagrams illustrating a structure of a signal transmission unit according to various embodiments of the present disclosure.

FIG. 5A is a cross-sectional view of a signal transmission unit 500 according to an embodiment of the present disclosure.

Referring to FIG. 5A, the signal transmission unit 500 may include a transmission line 510 for connecting the substrate and the antenna module. The transmission line 510 may be connected to the substrate including various elements of the electronic device at a first point 511 and connected to the antenna module at a second point 512.

The transmission line 510 may be interposed between a plurality of layers 520 and extended along a certain layer. In addition, the transmission line 510 may be surrounded by ground layers 531 and 532. The plurality of layers 520 forming the respective layers of PCB may be implemented as PPG.

The ground layers 531 and 532 may be formed on outer sides of the plurality of layers 520 in which the transmission line 510 is interposed. FIG. 2A is a cross-sectional view of the signal transmission unit 500. Therefore, although not shown in FIG. 5A, the ground layers 531 and 532 may be formed in the vertical direction as well as in the horizontal direction. For example, a certain ground layer (not shown) that connects the first and second ground layers 531 and 532 in a direction perpendicular to the plurality of layers 520 may be further formed.

Figure 5B:
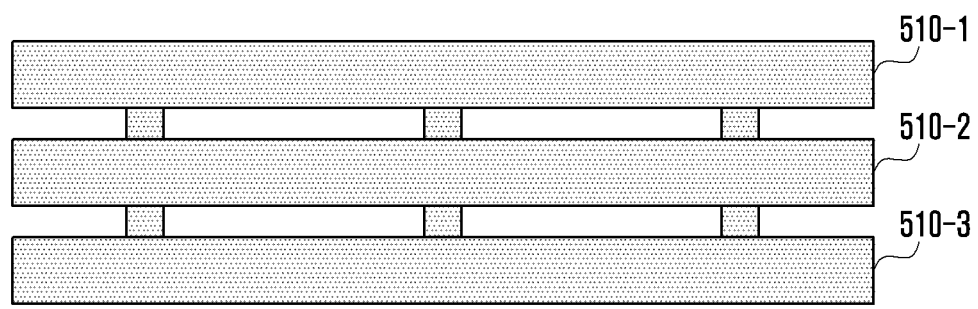

FIG. 5B is a top view of a portion 540 of the signal transmission unit 500 shown in FIG. 5A according to an embodiment of the present disclosure.

Referring to FIG. 5B, the transmission line 510 may be separated into a first sub-transmission line 510-1, a second sub-transmission line 510-2, and a third sub-transmission line 510-3 on the same layer, namely, between two adjacent layers.

Specifically, the transmission line 510 may be extended in a direction perpendicular to the plurality of layers at the first point 511 connected to the substrate.

Then, the transmission line 510 may be separated into the first sub-transmission line 510-1, the second sub-transmission line 510-2, and the third sub-transmission line 510-3 interposed between and extended along two adjacent layers among the plurality of layers 520.

The first sub-transmission line 510-1, the second sub-transmission line 510-2, and the third sub-transmission line 510-3 may be combined into one transmission line again. Then, the combined transmission line may be extended in a direction perpendicular to the plurality of layers and connected to the antenna module at the second point 512.

As shown in FIG. 5B, the first sub-transmission line 510-1, the second sub-transmission line 510-2, and the third sub-transmission line 510-3 may be connected to each other at certain points while being extended on the same layer.

FIGS. 6A, 6B, 6C, 6D illustrate an embodiment including additional ground lines when the transmission line is extended along a plurality of layers as described above according to various embodiments of the present disclosure.

Figure 6A:
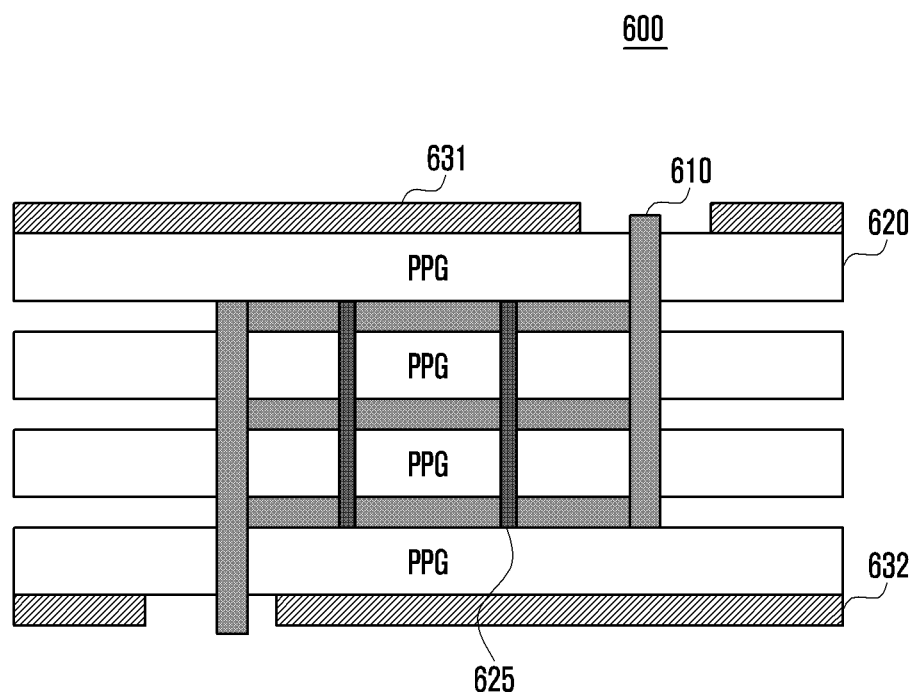
FIGS. 6A, 6B, 6C, and 6D are diagrams illustrating a structure of a signal transmission unit according to various embodiments of the present disclosure.
Figure 6B:
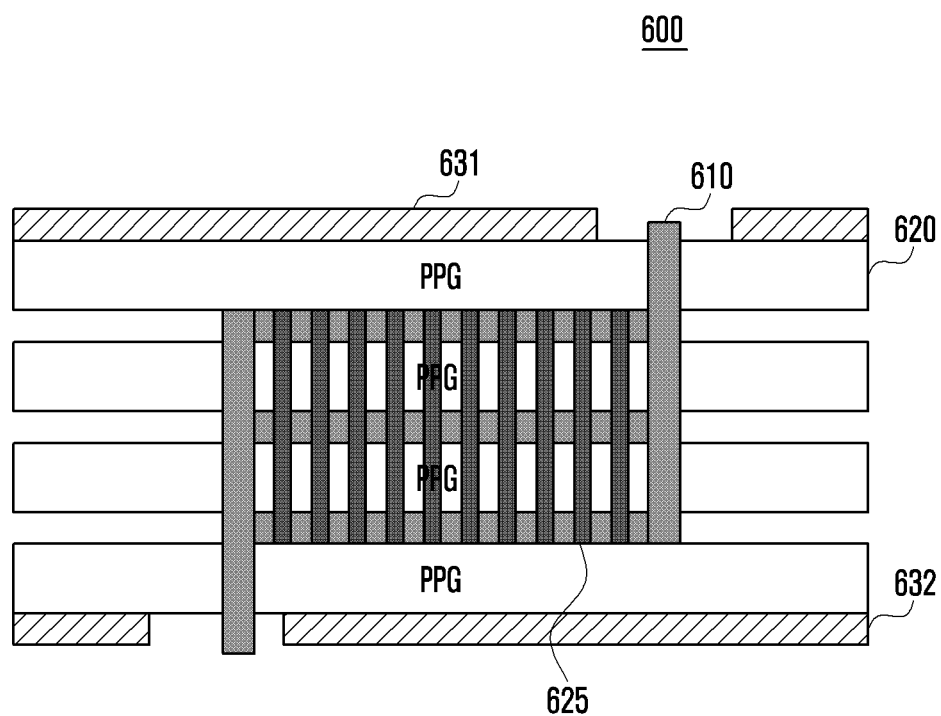

Referring to FIGS. 6A and 6B show an embodiment in which an additional ground line 625 is added to the above-discussed embodiment of FIG. 3A.

Specifically, a signal transmission unit 600 may include a transmission line 610 connected to the substrate and the antenna module. As described above, the transmission line 610 may refer to a path from one point connected to the substrate to another point connected to the antenna module. Also, the transmission line 610 may be branched into a plurality of sub-transmission lines respectively extended along a plurality of layers 620.

Meanwhile, as described above, the transmission line 610 may be surrounded by ground layers 631 and 632. The ground layers 631 and 632 may be formed on outer sides of the plurality of layers 620 in which the transmission line 610 is interposed.

FIGS. 6A and 6B are cross-sectional views of the signal transmission unit 600. Therefore, although not shown in FIGS. 6A and 6B, the ground layers 631 and 632 may be formed in the vertical direction as well as in the horizontal direction. For example, a certain ground layer (not shown) that connects the ground layers 631 and 632 in a direction perpendicular to the plurality of layers 620 may be further formed.

In addition, the signal transmission unit 600 may further include a ground line 625 that surrounds the plurality of sub-transmission lines and extends in a direction perpendicular to the plurality of layers 620. The ground line 625 is not limited in number. Therefore, two ground lines 625 are possible as shown in FIG. 6A, and also a plurality of ground lines 625 are possible as shown in FIG. 6B.

Figure 6C:
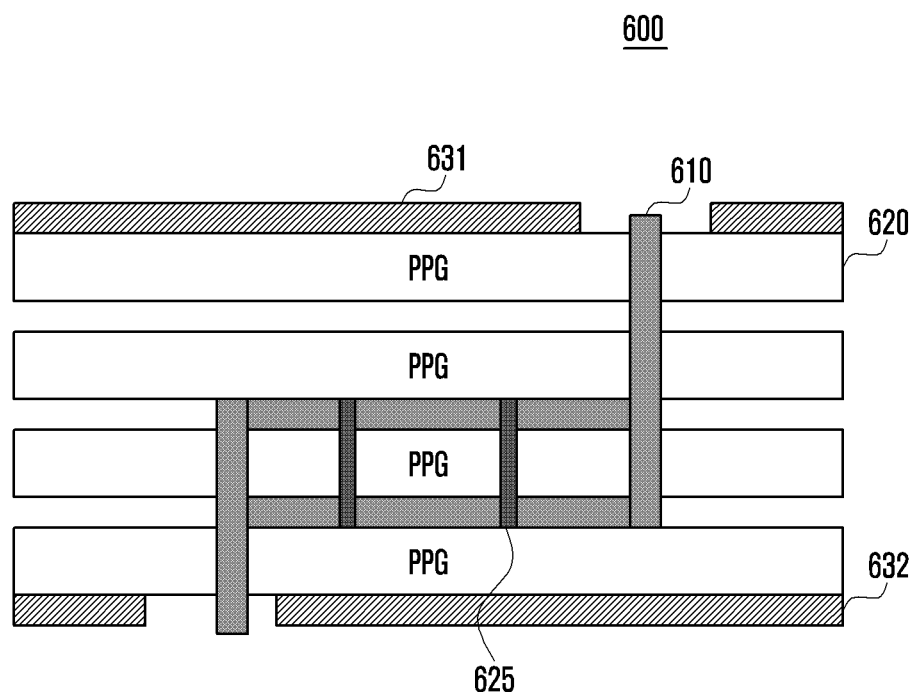
Figure 6D:
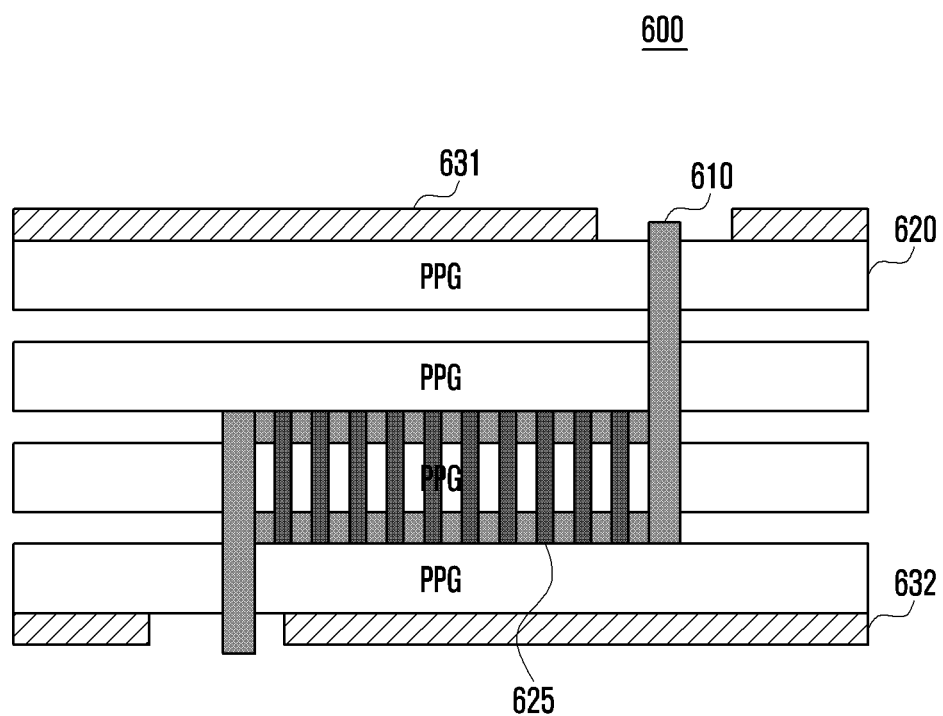

Referring to FIGS. 6C and 6D show an embodiment in which the additional ground line 625 is added to the above-discussed embodiment of FIG. 3B. Therefore, the additional ground line(s) as shown in FIGS. 6A to 6D may be added to embodiments in which the transmission line is branched into the plurality of sub-transmission lines in the same direction as the plurality of layers.

With the addition of the additional ground line(s), any undesirable loss that occurs in the transmission line during signal transmission may be reduced.

Figure 7:
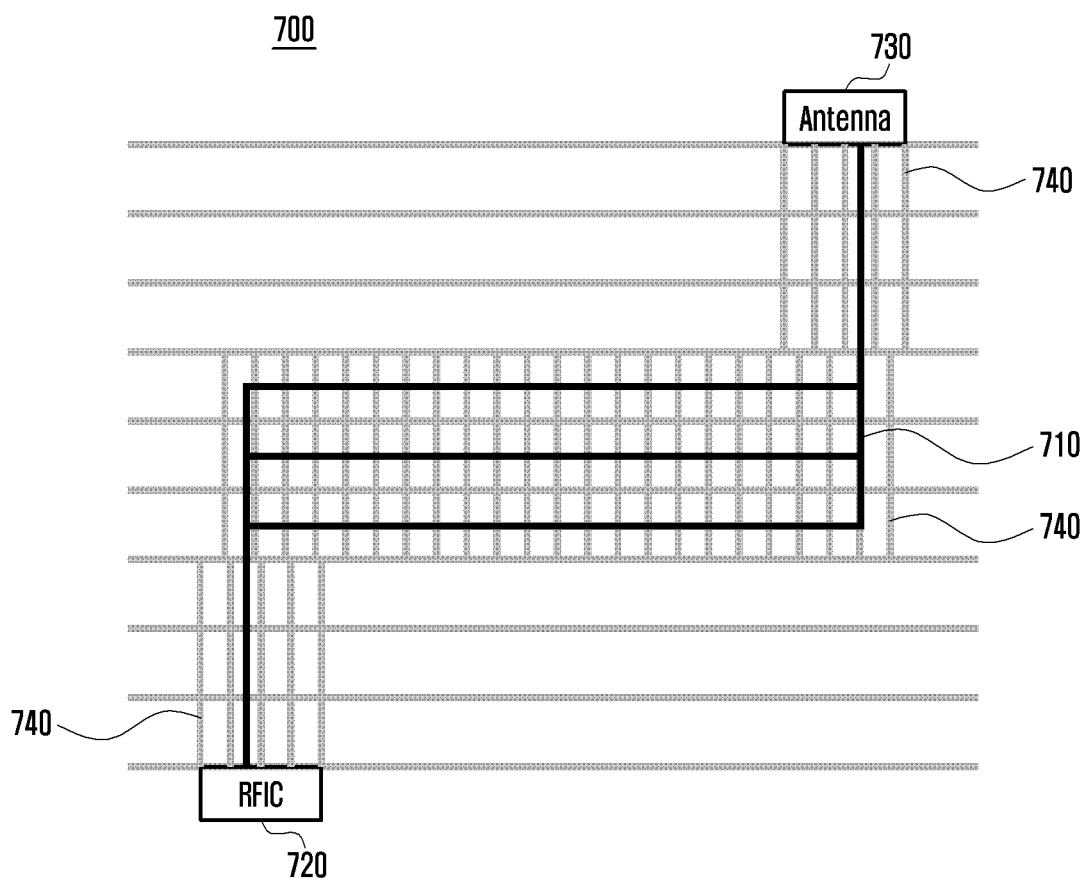
FIG. 7 is a diagram illustrating a connection layout between substrate elements and an antenna module using a transmission line portion of a multilayer printed circuit board according to an embodiment of the present disclosure.

FIG. 7 shows an electronic device 700 including a substrate, an antenna, and a transmission line connecting the substrate and the antenna according to an embodiment of the present disclosure.

Referring to FIG. 7, the substrate may be a multilayer PCB composed of a plurality of layers. In addition, an antenna module 730 may be connected to an upper part of the multilayer PCB.

A transmission line 710 connected to the antenna module 730 may be also connected to a radio frequency integrated circuit (RFIC) 720 through the multilayer. For example, when a signal to be transmitted by the electronic device is generated by the RFIC 720 or a signal generator included in the RFIC 720, the transmission line 710 may transmit the transmission signal to the antenna module 730.

The transmission line 710 may connect the RFIC 720 and the antenna module 730 through a plurality of layers. The plurality of layers used for the transmission line 710 may be some layers disposed at an upper part of the multilayer PCB.

The transmission line 710 may be surrounded by a ground layer 740. The ground layer 740 may be composed of a plurality of ground lines.

The electronic device 700 may include any type of the above-discussed signal transmission unit as well as a specific type shown in FIG. 7. The electronic device 700 including the signal transmission unit may minimize the loss of the generated signal and transmit the signal to another device.

While the present disclosure has been shown and described with reference to various embodiments thereof, it will be understood by those skilled in the art that various changes in form and details may be made therein without departing from the spirit and scope of the present disclosure as defined by the appended claims and their equivalents.

What is claimed is:

1. A printed circuit board comprising:
   a substrate comprising at least one layer; and
   a transmission line comprising a first sub-transmission line of the substrate, a second sub-transmission line of the substrate, and at least two third sub-transmission lines, each of the at least two third sub-transmission lines extended in a first direction being connected to both a first point of the first sub-transmission line and a second point of the second sub-transmission line,
   wherein at least two transmission paths are formed between the first point connected to a radio frequency integrated circuit and the second point connected to an antenna module,
   wherein a location of the first point is opposite to a location of the second point based on a second direction perpendicular to the first direction, and
   wherein the first point and the second point are surrounded by at least one ground layer.

2. The printed circuit board of claim 1,
   wherein the substrate comprises a first layer and a second layer which are formed in a stack,
   wherein the first point is located on outer side of the first layer and the second point is located on another outer side of the second layer, the one outer side being opposite to the another outer side on a direction of the stack, and
   wherein the first sub-transmission line passes through the first layer, the second sub-transmission line passes through the second layer, and at least two third sub-transmission lines are extended along the first layer.

3. The printed circuit board of claim 2,
   wherein the substrate further comprises at least one third layer between the first layer and the second layer,
   wherein the at least two third sub-transmission lines are branched between at least three adjacent layers, and wherein the at least two third sub-transmission lines are located to parallel each other.

4. The printed circuit board of claim 3, further comprising:
a ground layer formed on at least one of the first layer and the second layer.

5. The printed circuit board of claim 4, further comprising:
at least one ground line formed in a direction perpendicular to the at least three adjacent layers.

6. The printed circuit board of claim 2, wherein the at least two third sub-transmission lines are located on the first layer of the substrate.

7. The printed circuit board of claim 6, wherein each of the at least two third sub-transmission lines comprises at least two portions separated from each other.

8. The printed circuit board of claim 2,
wherein the substrate further comprises at least one third layer between the first layer and the second layer,
wherein a first set of the at least two third sub-transmission lines are branched between at least three adjacent layers, the first set of the at least two third sub-transmission lines being located to parallel each other, and
wherein a second set of the at least two third sub-transmission lines are located on the first layer.

9. The printed circuit board of claim 2, wherein each of the at least two third sub-transmission lines are surrounded by ground layers.

10. An electronic device comprising:
a printed circuit board;
a radio frequency integrated circuit; and
an antenna module,
wherein the printed circuit board includes:
a substrate comprising at least one layer; and
a transmission line comprising a first sub-transmission line of the substrate, a second sub-transmission line of the substrate, and at least two third sub-transmission lines, each of the at least two third sub-transmission lines extended in a first direction being connected to both a first point of the first sub-transmission line and a second point of the second sub-transmission line, and
wherein at least two transmission paths are formed between the first point connected to a radio frequency integrated circuit and the second point connected to an antenna module,
wherein a location of the first point is opposite to a location of the second point based on a second direction perpendicular to the first direction, and
wherein the first point and the second point are surrounded by at least one ground layer.

11. The electronic device of claim 10,
wherein the substrate comprises a first layer and a second layer which are formed in a stack,
wherein the first point is located on outer side of the first layer and the second point is located on another outer side of the second layer, the one outer side being opposite to the another outer side on a direction of the stack, and
wherein the first sub-transmission line passes through the first layer, the second sub-transmission line passes through the second layer, and at least two third sub-transmission lines are extended along the first layer.

12. The electronic device of claim 11,
wherein the substrate further comprises at least one third layer between the first layer and the second layer,
wherein the at least two third sub-transmission lines are branched between at least three adjacent layers, and
wherein the at least two third sub-transmission lines are located to parallel each other.

13. The electronic device of claim 12, wherein the printed circuit board further comprises a ground layer formed on at least one of the first layer and the second layer.

14. The electronic device of claim 13, wherein the printed circuit board further comprises at least one ground line formed in a direction perpendicular to the at least three adjacent layers.

15. The electronic device of claim 11,
wherein the at least two third sub-transmission lines are located on the first layer of the substrate.

16. The electronic device of claim 15, wherein each of the at least two third sub-transmission lines comprises at least two portions separated from each other.

17. The electronic device of claim 11,
wherein the substrate further comprises at least one third layer between the first layer and the second layer,
wherein a first set of the at least two third sub-transmission lines are branched between at least three adjacent layers, the first set of the at least two third sub-transmission lines being located to parallel each other, and
wherein a second set of the at least two third sub-transmission lines are located on the first layer.

\* \* \* \* \*